United States Patent [19]

Bitting

[11] Patent Number: 5,455,816
[45] Date of Patent: Oct. 3, 1995

[54] MOS AMPLIFIER WITH GAIN CONTROL

[75] Inventor: Ricky F. Bitting, Fort Collins, Colo.

[73] Assignees: AT&T Global Information Solutions Company, Dayton, Ohio; Hyundai Electronics America, Milpitas, Calif.

[21] Appl. No.: 885,711

[22] Filed: May 18, 1992

[51] Int. Cl.$^6$ .................... G11B 5/09; H03F 3/45
[52] U.S. Cl. .................. 369/124; 360/46; 360/67; 330/254; 330/252
[58] Field of Search .............. 369/124, 105, 369/44.13, 44.26; 360/46, 67; 330/254, 252, 258, 279

[56] References Cited

U.S. PATENT DOCUMENTS

| | | | |
|---|---|---|---|
| 4,184,124 | 1/1980 | Asakawa | 330/264 |
| 4,459,555 | 7/1984 | Jett, Jr. | 330/254 |
| 4,578,723 | 3/1986 | Betts et al. | 360/67 |
| 4,622,599 | 11/1986 | Norton, Jr. | 360/46 |
| 4,667,165 | 5/1987 | De Weck | 330/253 |
| 4,712,144 | 12/1987 | Klaassen | 360/67 |
| 4,766,394 | 8/1988 | Yukawa | 330/253 |
| 4,772,964 | 9/1988 | Kaida | 360/67 |
| 4,777,472 | 10/1988 | Sauer et al. | 330/253 |
| 4,849,711 | 7/1989 | Leis et al. | 330/279 |
| 4,849,834 | 7/1989 | Allen | 360/67 |
| 4,973,915 | 11/1990 | Batey | 360/46 |
| 5,051,847 | 9/1991 | Philipps | 360/46 |
| 5,124,849 | 6/1992 | Chur | 360/46 |
| 5,132,852 | 7/1992 | Price, Jr. | 360/46 |
| 5,142,238 | 8/1992 | White | 330/252 |
| 5,168,395 | 12/1992 | Klaassen et al. | 360/46 |
| 5,184,090 | 2/1993 | Anzai | 360/67 |
| 5,257,146 | 10/1993 | Price, Jr. et al. | 360/67 |
| 5,270,882 | 12/1993 | Jove et al. | 360/67 |
| 5,280,196 | 1/1994 | Shinozaki | 360/67 |
| 5,309,298 | 5/1994 | Klaasen et al. | 360/67 |
| 5,319,508 | 6/1994 | Tsunoda et al. | 360/67 |
| 5,327,297 | 7/1994 | Enami et al. | 360/46 |

*Primary Examiner*—Scott J. Sugarman
*Assistant Examiner*—Kim-Kwok Chu
*Attorney, Agent, or Firm*—Wayne P. Bailey; Gregory A. Welte

[57] ABSTRACT

The invention concerns differential amplifiers for computer disc drives, implemented in Metal Oxide Semiconductor (MOS) technology. The amplifiers are of the controllable-gain type. Gain is controlled by adjusting the channel current which passes through the differential Field-Effect Transistors (FETs) of the amplifier. The channel current can be viewed as having a constant component, to which is added an adjustment component. The adjustment component does not pass through the active loads of the differential amplifier, thereby allowing a larger change in gain to be attained.

13 Claims, 18 Drawing Sheets

MOS AMPLIFIER WITH GAIN CONTROL

The invention relates to electronic amplifiers and, in particular, to amplifiers having gain control, which can be used to amplify data signals in computer disc drives.

BACKGROUND OF THE INVENTION

Computers store data on magnetic discs, both of the "floppy" and "fixed" type, as well as on magnetic tape. The operation of a disc drive can be explained with reference to FIGS. 1A–1C.

A rotating disc 1 contains data arranged in concentric tracks 2. To read data, a movable read/write head 5 in FIG. 1B is positioned above the particular track 2 containing the data of interest.

The data bits can be viewed as tiny magnets 7 in FIG. 1C. When a moving bit-magnet passes beneath the head 5, it excites a coil 9 within the head 5, inducing an electrical signal in the coil. The induced signal is small, of the order of a few millivolts. Further, the size of the signal changes as radial distance of the head changes. That is, when the head 5 is positioned near the center of rotation, at a small radius, the relative speed of rotation between the head 5 and the disc 1 is small. The small speed produces a small signal.

Conversely, when the head 5 is positioned far away from the center, the speed is large, and the signal produced by the coil 9 is large.

(In more complex terms, the signal produced by the coil depends on $d\Phi/dt$, which is the first time derivative of flux density, $\Phi$. The lines 10 in FIG. 1C indicate flux lines.)

The signal must be amplified. In the amplifier, Automatic Gain Control (AGC) circuits are used to compensate for the change in signal magnitude. When the signal is small, the gain of the amplifier is made large. When the signal is large, the gain is less.

The amplifiers in common use today are differential amplifiers which use bipolar junction transistors. As the technology of disc drives advances, such amplifiers will become unfeasible to use, because of their relatively large size and large power consumption. Further, using CMOS technologies allows analog circuitry to be integrated with complex digital circuitry on a single chip, in order to obtain higher levels of integration.

OBJECTS OF THE INVENTION

It is an object of the invention to provide an automatic gain control circuit for an amplifier.

It is a further object of the invention to provide an automatic gain control for an amplifier of the CMOS type.

SUMMARY OF THE INVENTION

In one form of the invention, a differential amplifier in a computer disc drive is constructed using MOS devices (not JFET devices). The differential amplifier is equipped with gain control, which adjusts gain by adjusting current passing through the differential FETs in the amplifier.

BRIEF DESCRIPTION OF THE DRAWINGS

In FIG. 12, the load FETs are n-channel devices.

DETAILED DESCRIPTION OF THE INVENTION

Simplified Differential Amplifier

Figure 1A:
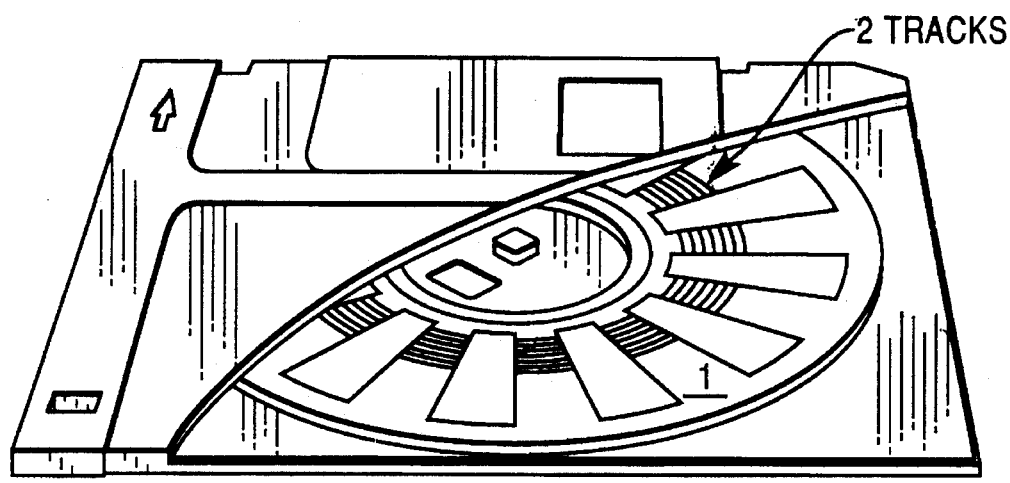
FIG. 1A illustrates a floppy disc.
Figure 1B:
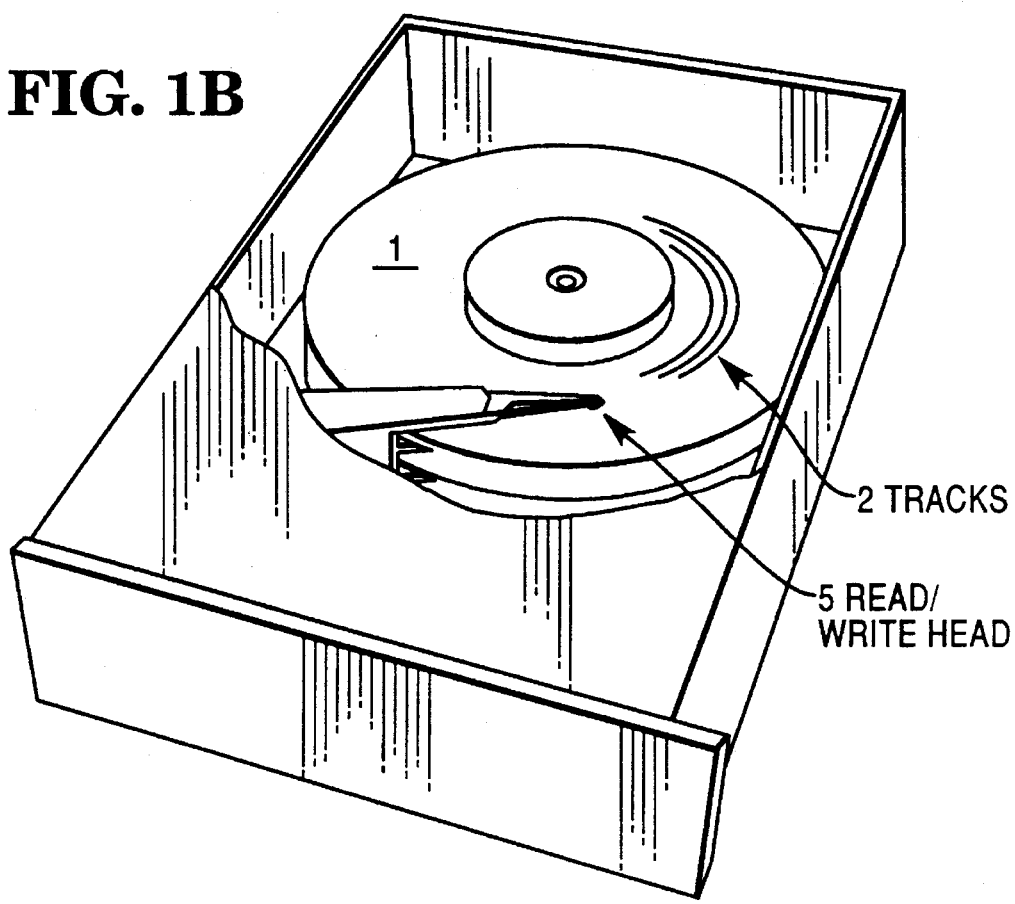
FIG. 1B illustrates a fixed computer disc drive.
Figure 1C:
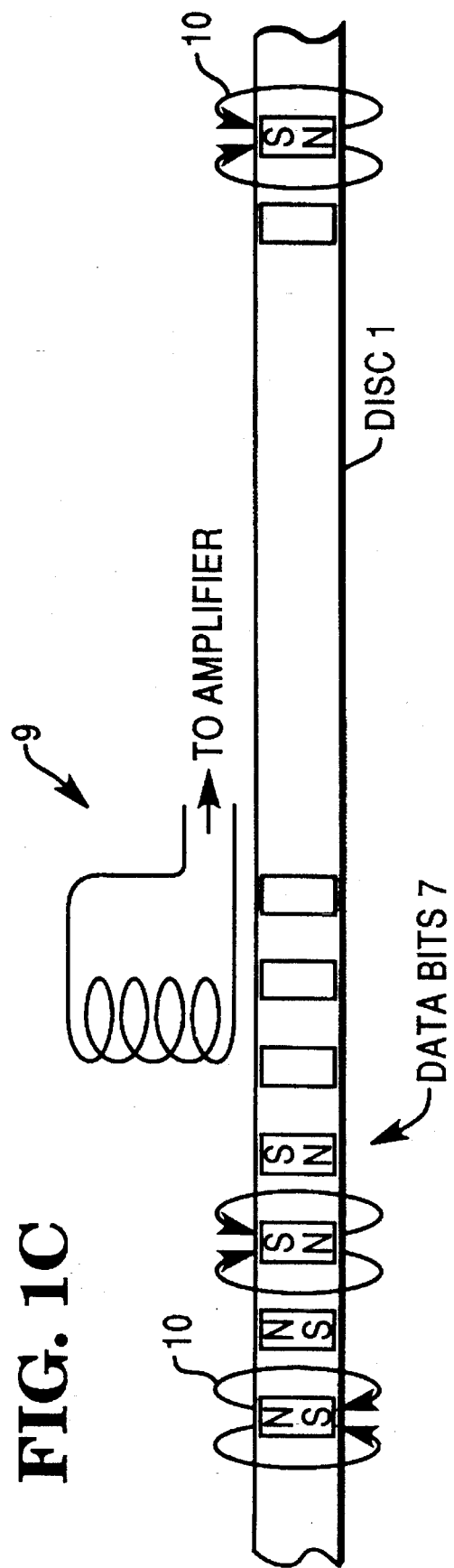
FIG. 1C is a cross-sectional view of the magnetic media used in a disc drive, schematically showing magnets 7, which represent data bits.
Figure 2:
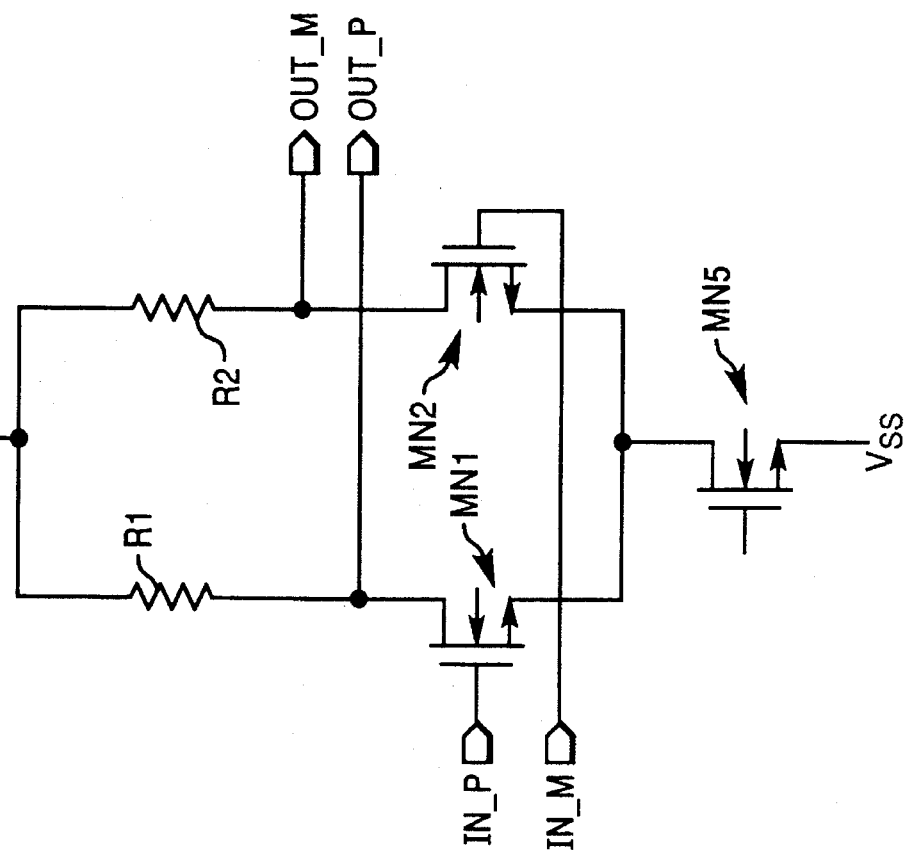
FIG. 2 illustrates a simplified differential amplifier. Differential amplifiers are used to read the signals produced by the read/write head 5 in FIG. 1B.
Figure 3:
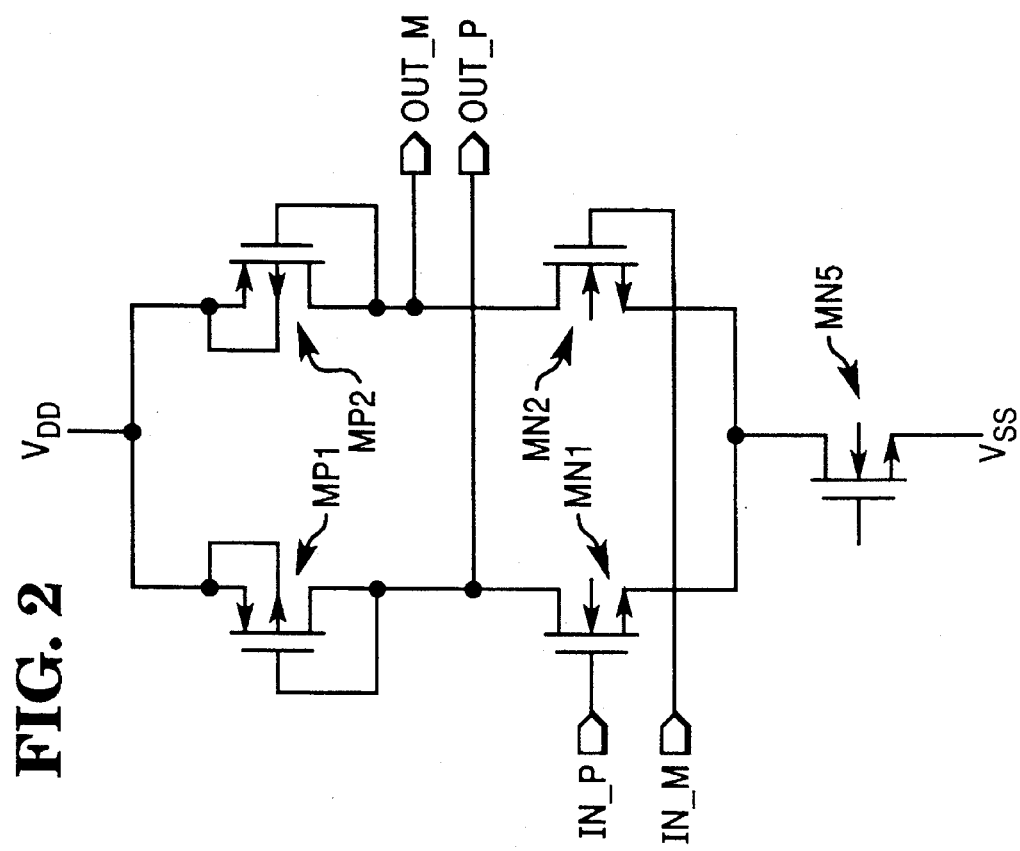
FIG. 3 illustrates the differential amplifier of FIG. 2, but with resistors replacing the active loads.

FIG. 2 illustrates a simple differential amplifier. There are two loads on the amplifier, in the form of Field-Effect Transistors (FETs) MP1 and MP2, which are configured as active loads. For some purposes, these load-FETs can be viewed as resistors R1 and R2 as indicated in FIG. 3. A constant current source is provided, in the form of FET MN5. Differential FETs MN1 and MN2 share the constant current.

Active loads are used, rather than resistors, because the active loads have a lower capacitance than the resistors. One reason for the lower capacitance is that the active loads occupy a smaller surface area than do the resistors. The lower capacitance provides an improvement in bandwidth.

In operation, when the input voltages IN_P and IN_M are equal, the current passing through the constant-current-source-FET MN5 is divided equally between the differential FETs MN1 and MN2. Consequently, the voltage drop across the load resistors R1 and R2 in FIG. 3 are equal, producing output voltages OUT_P and OUT_M which are equal.

When the voltages IN_P and IN_M are different, the currents carried by the differential FETs MN1 and MN2 are different (but still total that provided by MN5). Consequently, the currents passing through output resistors R1 and R2 are different, and the voltage drops across these resistors will be different. The output voltages OUT_P and OUT_M are no longer equal: a voltage difference appears.

Current Gain, $g_m$, Depends on Channel Current

The current gain $g_m$ (more specifically, the transconductance, or ratio of channel current to gate voltage) of an FET is a function of the square root of channel current. See Sedra and Smith, *Microelectronic Circuits*, chapter 6.7, especially equation (6.40) (Holt, Rinehart and Winston, 1987, ISBN 0-03-007328-6.) This book is incorporated by reference. Thus, as the channel current changes, the gain (ie, transconductance) changes.

Invention Provides Second Current Source

Figure 4:
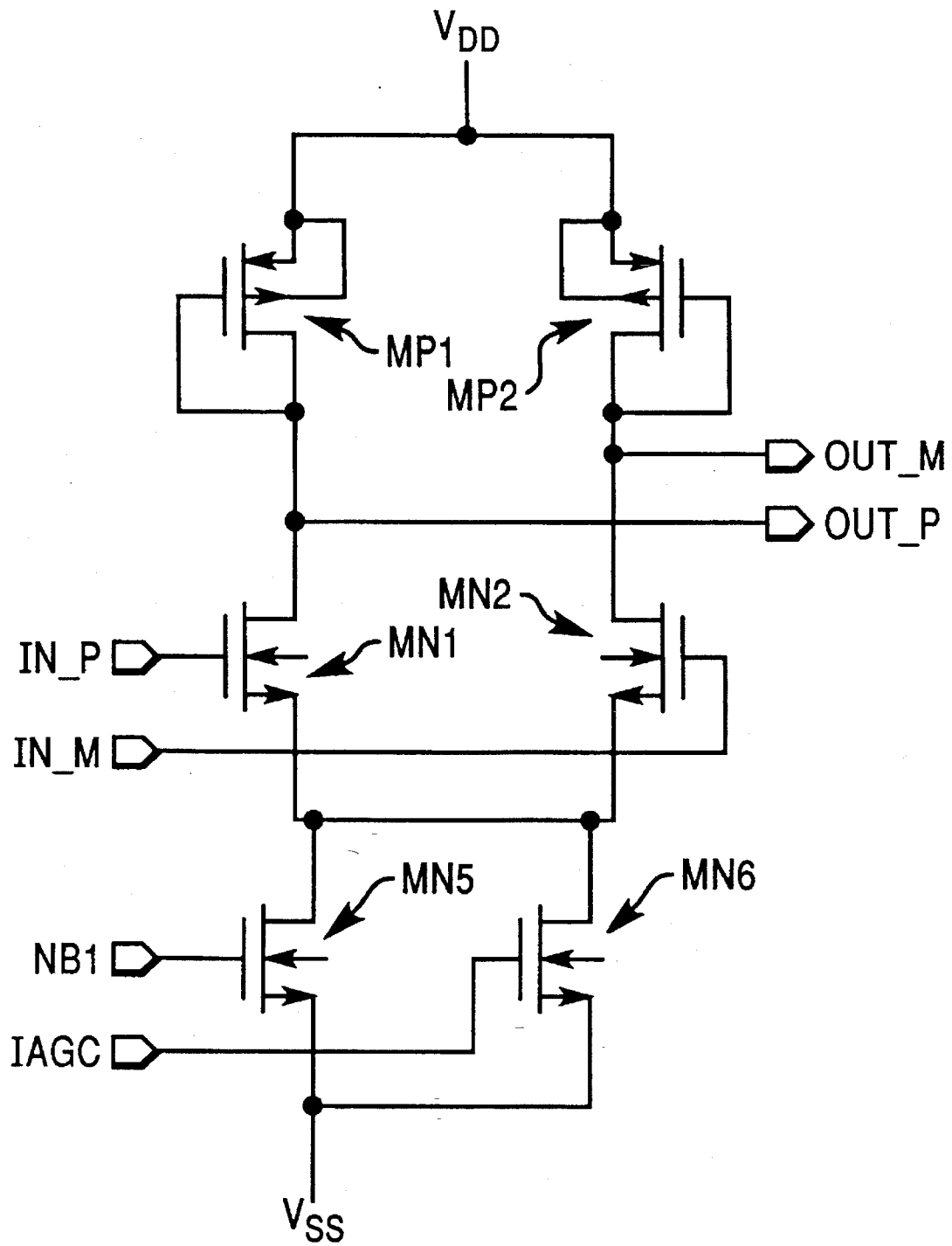
FIG. 4 illustrates the differential amplifier of FIG. 2, but with an added current source, MN6.

The invention adjusts the channel current, in order to change gain. FIG. 4 shows one apparatus for changing the gain. A second current source MN6 provides additional current. Now, the total current passing through the differential transistors MN1 and MN2 is larger: it is the sum of the currents provided by MN5 and MN6. The magnitude of the additional current is controlled by signal IAGC, which controls the current passing through FET MN6.

Therefore, the total current passing through the differential FETs MN1 and MN2 can be adjusted by signal IAGC, thereby adjusting the transconductance of the differential FETs MN1 and MN2, and thereby adjusting the gain of this differential FET pair.

The reader is reminded that the current under discussion has two components, namely, (1) the d.c. "bias" component and (2) the small signal component. The gain, $g_m$, in question is the gain of the small signal component.

Increasing Current Through Differential FETs Reduces Resistance of Active-Load-FETs Increasing the gain of the differential pair, by itself, does not necessarily increase the gain of the overall amplifier. A simplified reason is that the small-signal resistance presented by the load-FETs MP1 and MP2 depends on $1/g_m$, wherein $g_m$ is the transconductance of the respective FET MP1 or MP2. (See Sedra and Smith, section 7.7, page 367.)

Thus, as the bias current increases, $1/g_m$ of the load-FETs decreases, but $g_m$ of the differential FETs increases. These opposite changes tend to offset each other: the overall gain of the amplifier does not significantly change.

Invention Routes Added Current Around Load-FETs

Figure 5:
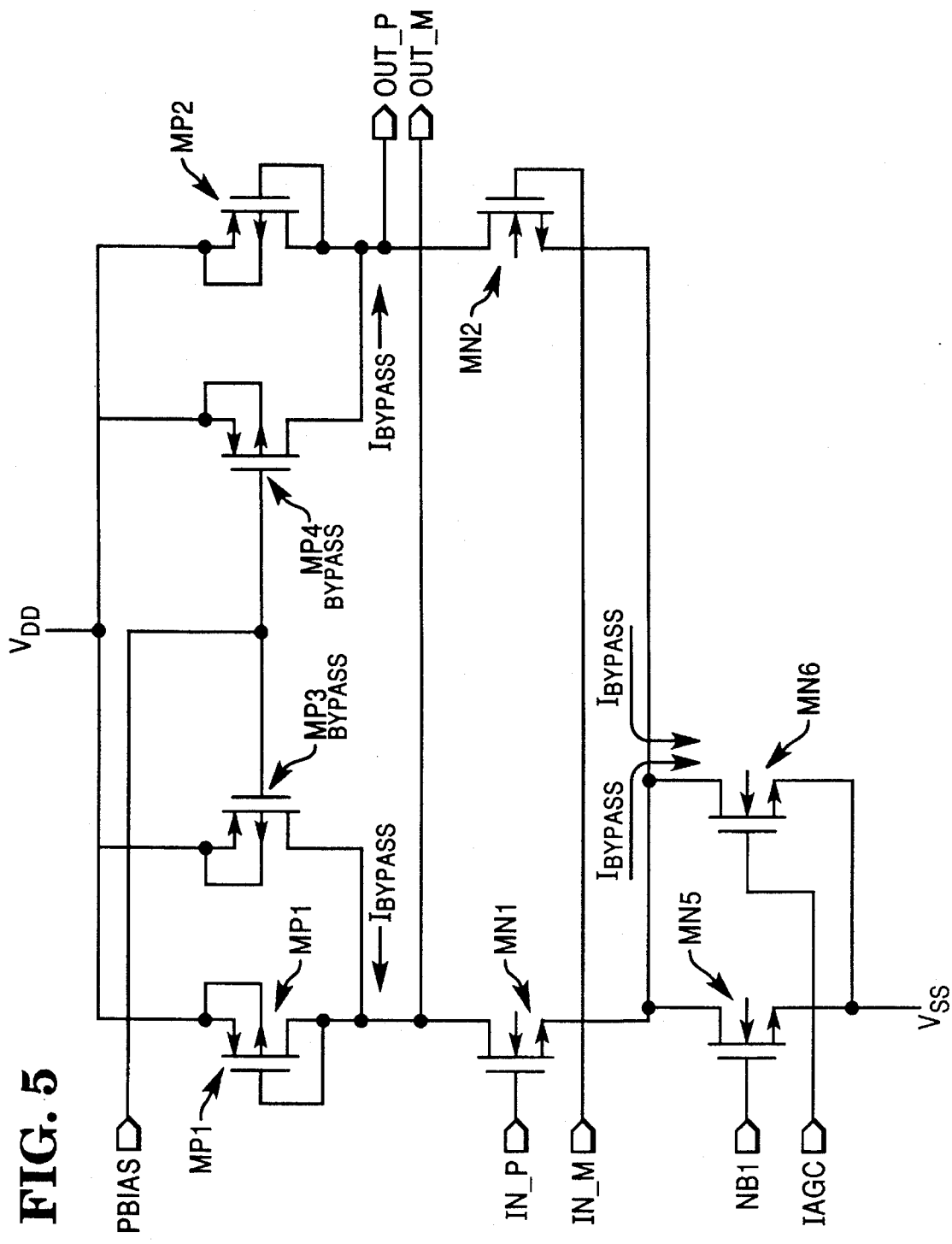
FIG. 5 illustrates the differential amplifier of FIG. 4, but with added bypass transistors, MP3 and MP4.
Figure 6:
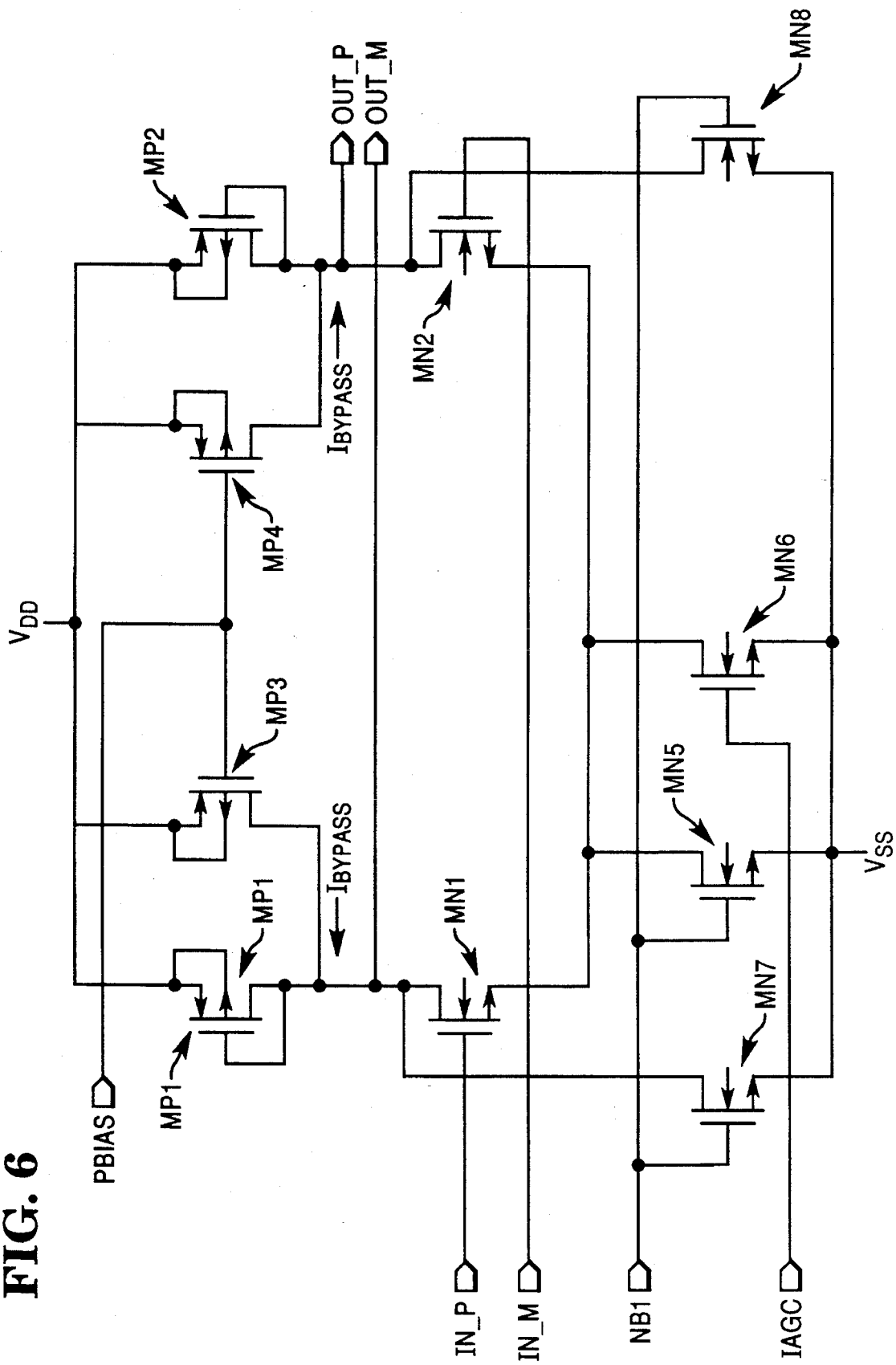
FIG. 6 illustrates the differential amplifier of FIG. 5, but with added shunt transistors MN7 and MN8.

To counteract this offset, the invention adds bypass FETs MP3 and MP4, as shown in FIG. 5. These bypass FETs provide additional current $I_{bypass}$ to the differential FETs MN1 and MN2, independent of the current passing through the load-FETs MP1 and MP2. Most, and preferably all, of $I_{bypass}$ is sunk by the second current source MN6, as indicated by the paired arrows entering MN6.

Thus, the gain of the differential FETs has increased, by increasing the channel current in the differential FETs, without reducing the resistance of the primary load-FETs MP1 and MP2. The gain of the overall amplifier has increased.

The bypass FETs MP3 and MP4 are in saturation. Consequently, their output resistances are much greater than those of MP1 and MP2, and do not significantly affect the gain, even though they are placed in parallel with the active loads MP1 and MP2. The primary function of the bypass FETs is to maintain the DC current in MP1 and MP2 constant while variations in $I_{AGC}$ occur. The bypass FETs MP3 and MP4 maintain the bandwidth of the amplifier relatively constant, as $I_{AGC}$ changes, because the resistances of the load FETs remain substantially constant, as does the load capacitances presented by these FETs.

FETs MN7 and MN8

FETs MN7 and MN8 shift the bias currents, which pass through MP1 and MP2, away from MN1 and MN2. MN7 and MN8 can be viewed as shunt FETs: they shunt bias current away from MN1 and MN2.

That is, the amplifier can be divided into two halves, namely, (1) MP1 and MN1 and (2) MP2 and MN2. If MN7 and MN8 were not present, the bias currents in each half (if $I_{AGC=0}$) would be $I_{B1}/2$, where $I_{B1}$ is the current passing through MN5. MN7 and MN8 each add current equal to $I_{B1}$, thus raising the bias current in MP1 and MP2 to $(3/2) \times I_{B1}$. (That is, the bias current in each half, (1) MP1 and MN1 and (2) MP2 and MN2, is $I_{B1}+I_{B1}/2$.)

This increased current in MP1 and MP2 lowers $1/g_m$, thereby lowering the amplifier gain, but increases the bandwidth of the amplifier, as the computer simulations, discussed later, have shown. Without the addition of MN7 and MN8, in order to achieve a similar bandwidth, the currents in MN1 and MN2 must be increased. However, increasing the currents in MN1 and MN2 will result in a minimum gains (when $I_{AGC}=0$) which is too high.

Therefore, the configuration allows (a) the required bandwidth and (b) the desired minimum-to-maximum gain ratio to be realized simultaneously.

Characterization

The operation just described can be characterized in the following manner.

Figure 7:
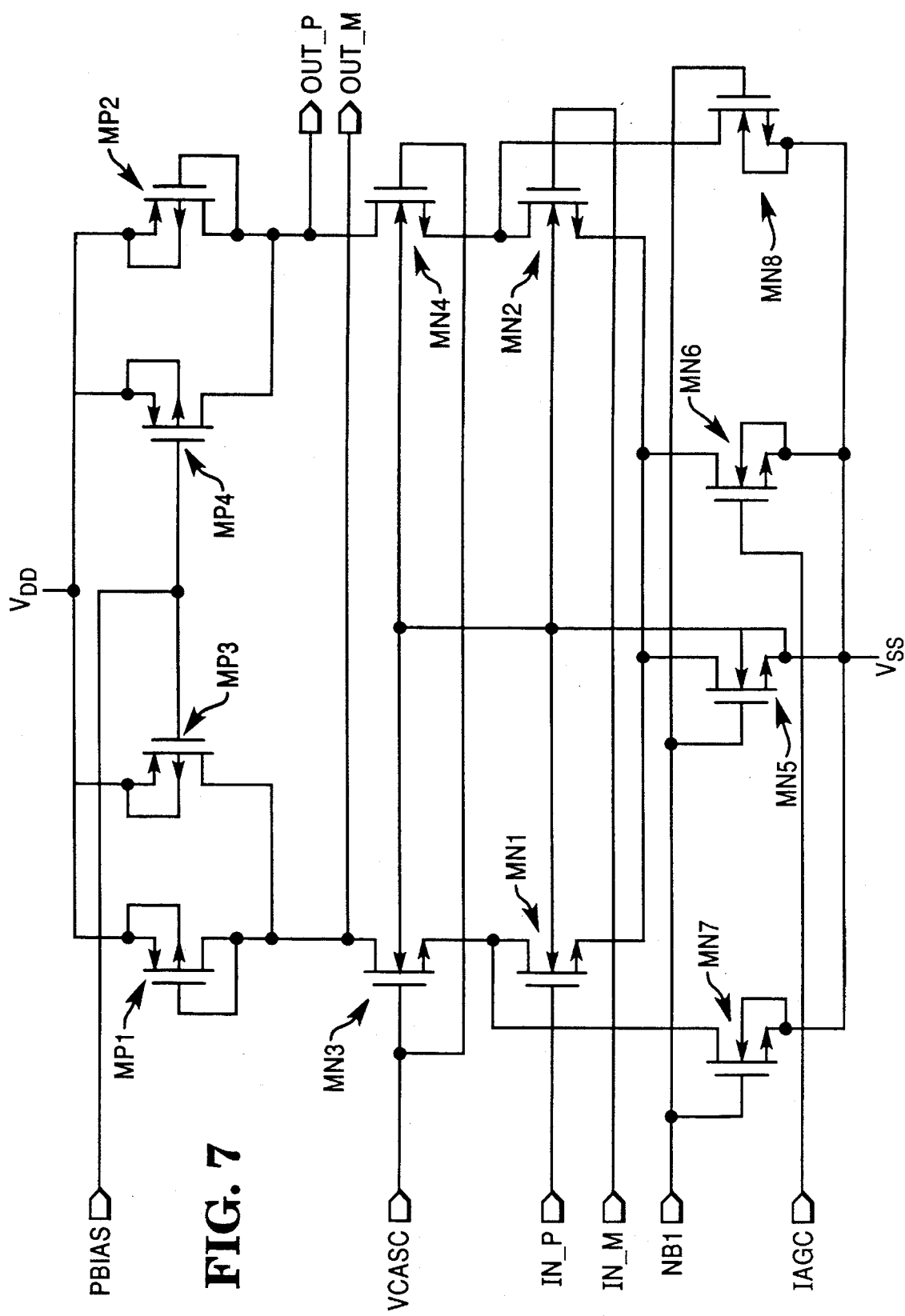
FIG. 7 illustrates the differential amplifier of FIG. 6, but with added transistors MN3 and MN4, which perform a cascode function.

The current passing through the differential transistors MN1 and MN2 in FIG. 7 can be viewed as having three components, namely, a base component, an adjustment component, and a small-signal component.

The base component is provided by the constant current source MN5.

The adjustment component is carried by bypass transistors MP3 and MP4, and second source MN6. The adjustment component does not pass through the load resistors MP1 and MP2.

The small-signal component is that known in the art.

Further, FETs MN7 and MN8 serve to drive the differential FETs into pinch-off when the prevailing gate voltages would tend to drive the differential FETs into the OFF condition.

Cascode Configuration

FIG. 7 shows two added FETs, namely, MN3 and MN4. These provide a cascode configuration, as known in the art. The cascode configuration provides increased bandwidth of the amplifier stage, together with reduced input capacitance, which minimizes loading on the previous stages.

Larger Amplifier

Figure 8A:
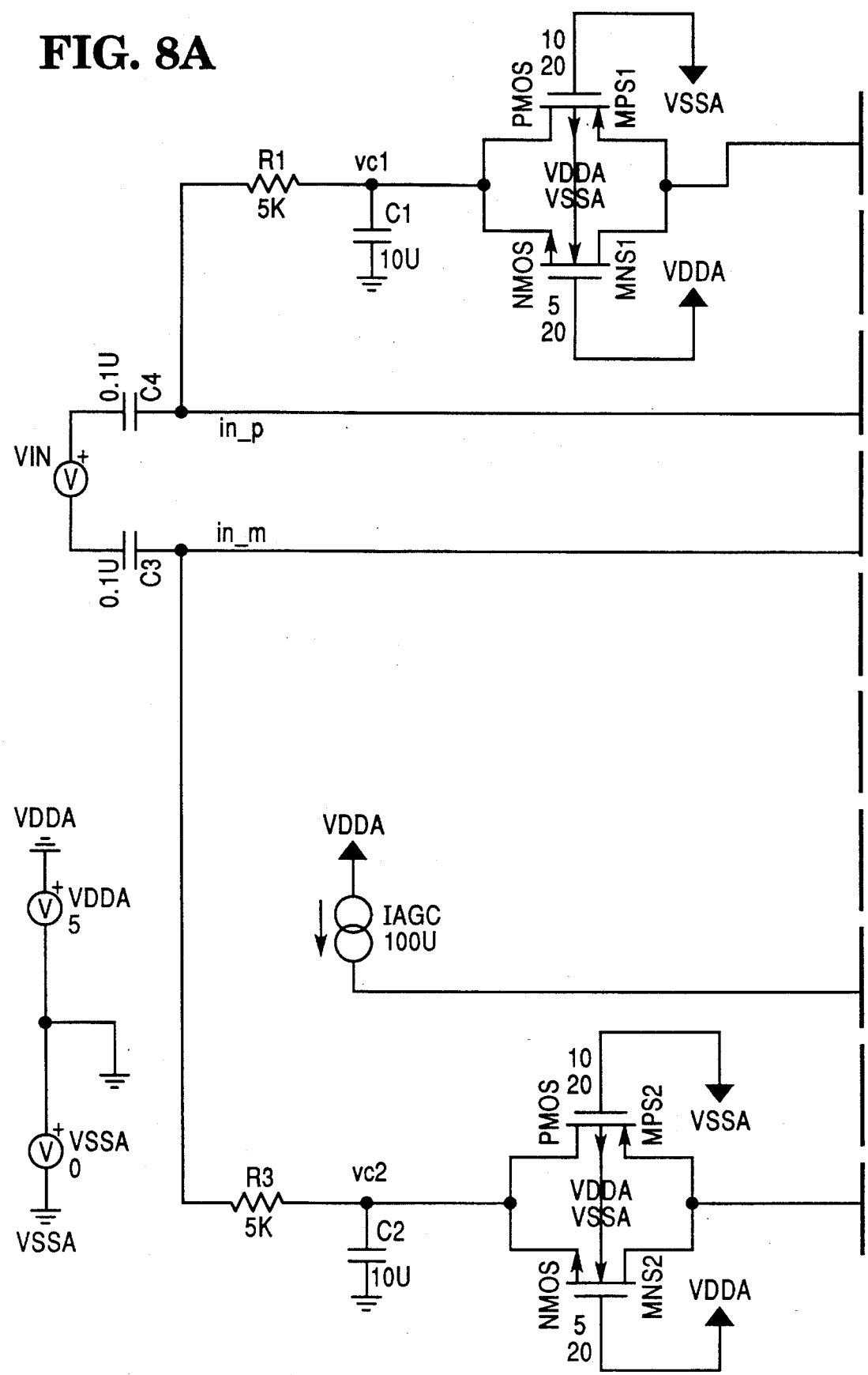
FIGS. 8A, 8B, and 8C illustrates three of the amplifiers of FIG. 7, cascaded into a larger amplifier.
Figure 8B:
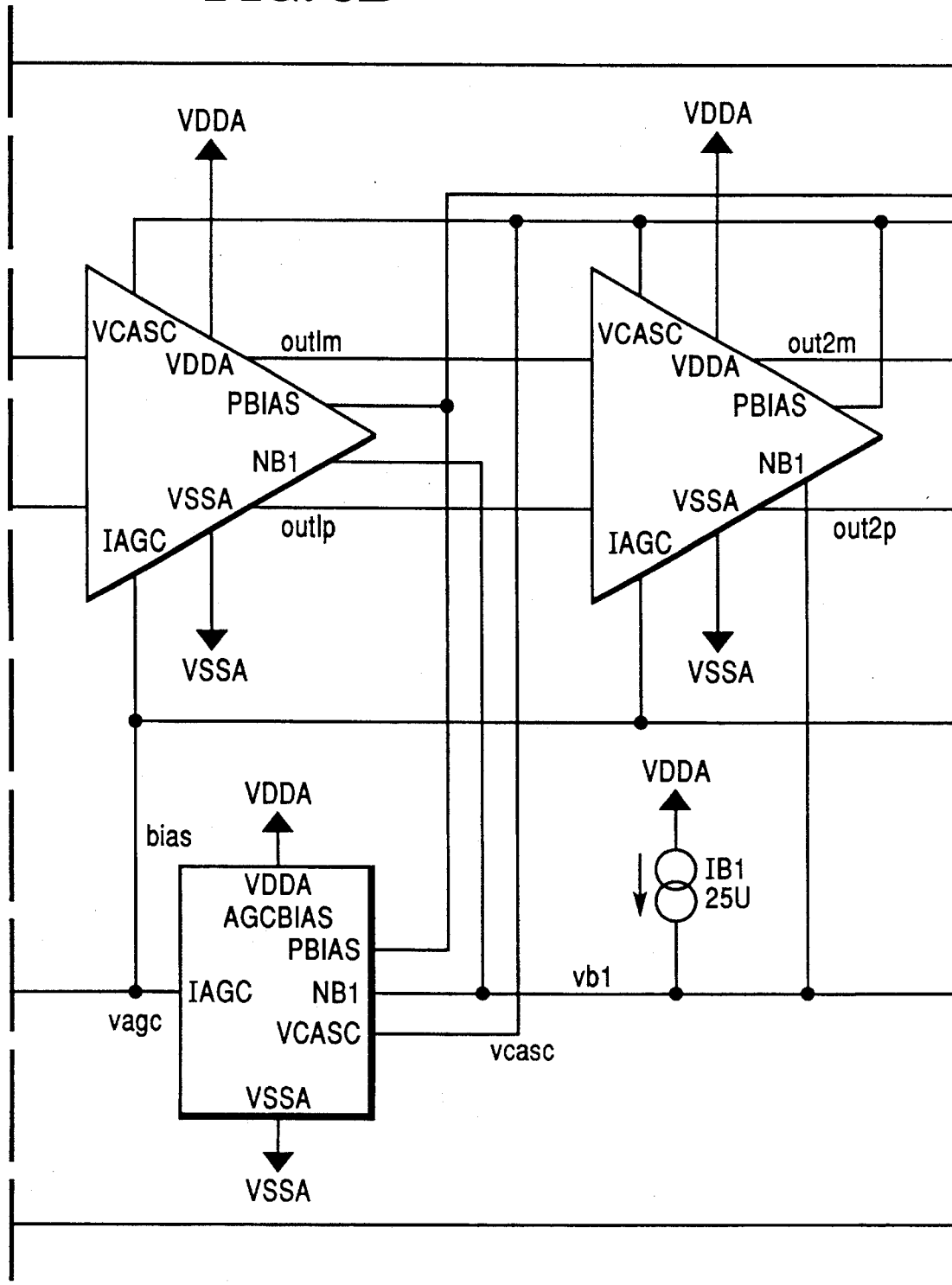
Figure 8C:
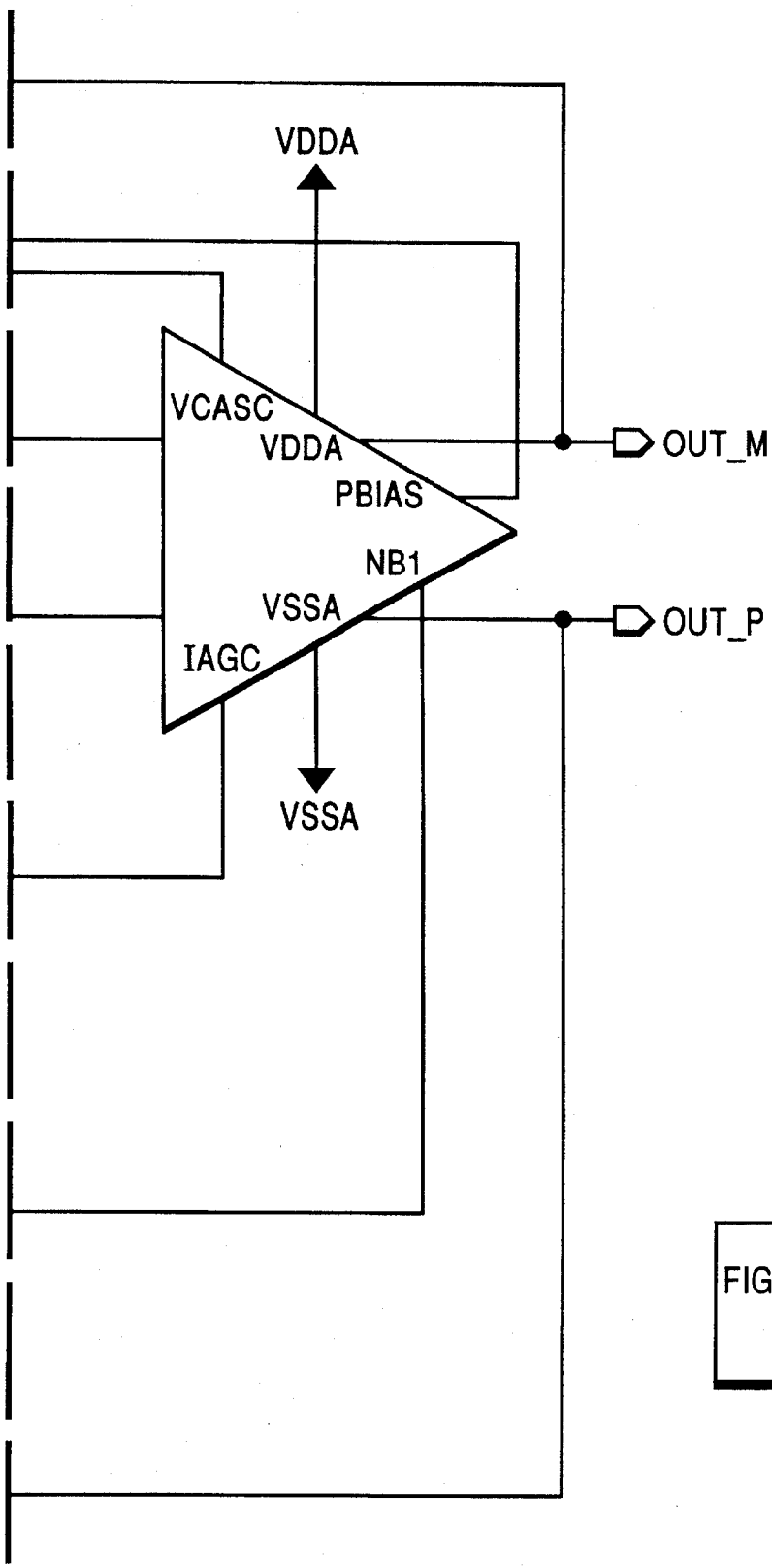
Figure 8:
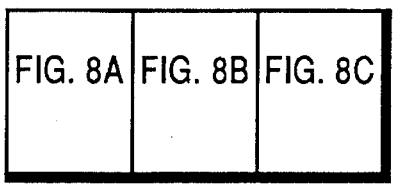

The amplifier discussed above provides one stage of the overall amplifier, shown in FIG. 8. Multiple stages are required in order to obtain a controlled minimum-to-maximum gain ratio of about 30 to 40 dB. The amplifier is capacitively coupled to the inputs (eg, a read/write head, or to a preamplifier connected to the head), by capacitors C3 and C4. Unity-gain d.c. feedback is provided by blocks 100 and 102. Such feedback is known in the art, and maintains proper d.c. operation in all stages, and also compensates for mispatch in the FETs of which the amplifiers are constructed.

The gain control lines PBIAS, IAGC, and NB1 in FIG. 7 are controlled by a control circuit 107 in FIG. 8. (PBIAS and NB1 are preferably constant voltages.) Such control circuits are known in the art. The AGC loop is used to control $I_{AGC}$. The output of the amplifier is rectified and compared to a reference level. The feedback loops act to keep the output level constant over a wide range of input levels, as required when amplifying a signal derived from a disc drive, as discussed in the Background.

Figure 9:
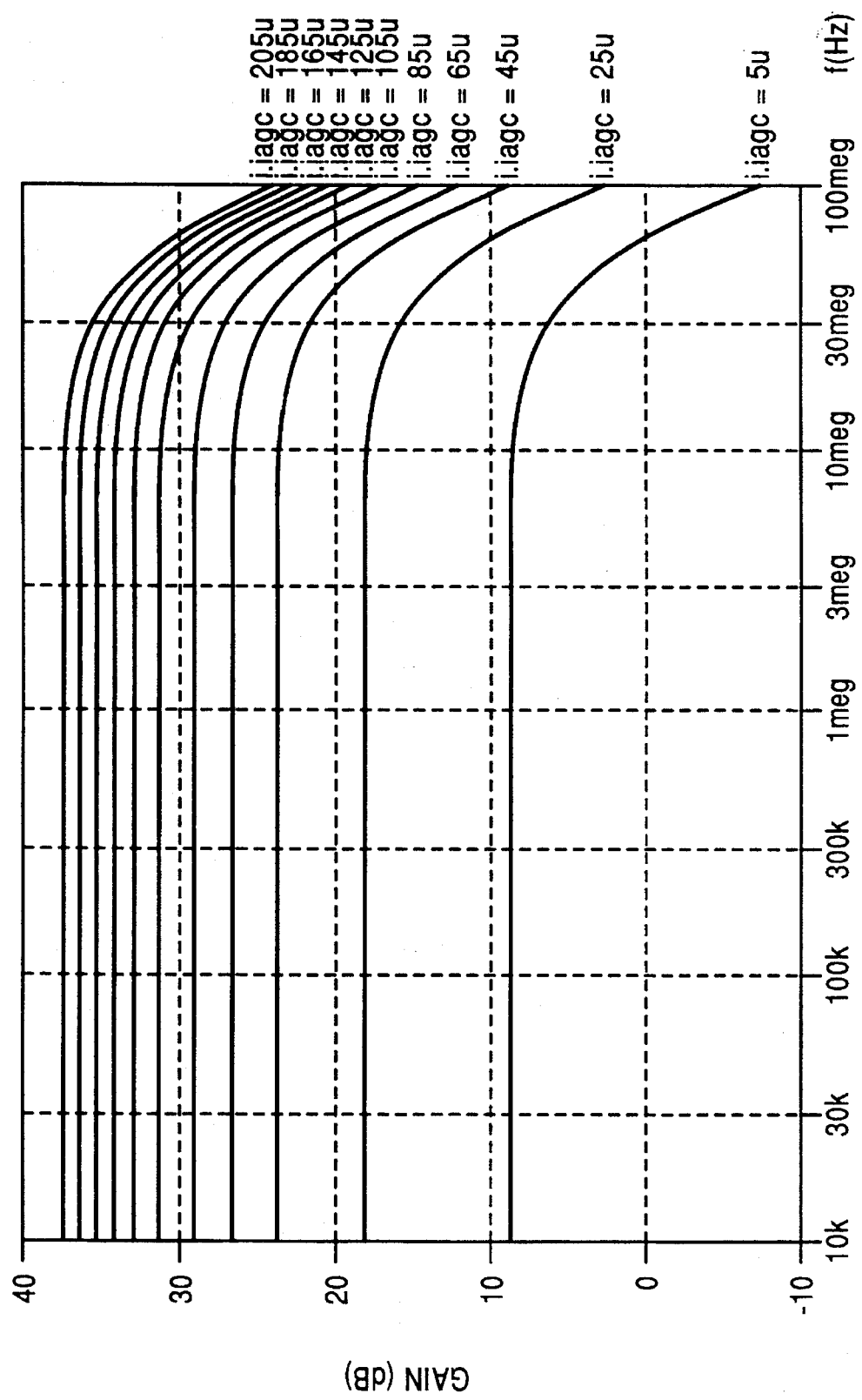
FIG. 9 shows the gain of the amplifier of FIG. 8, for different values of IAGC, plotted against frequency.
Figure 10:
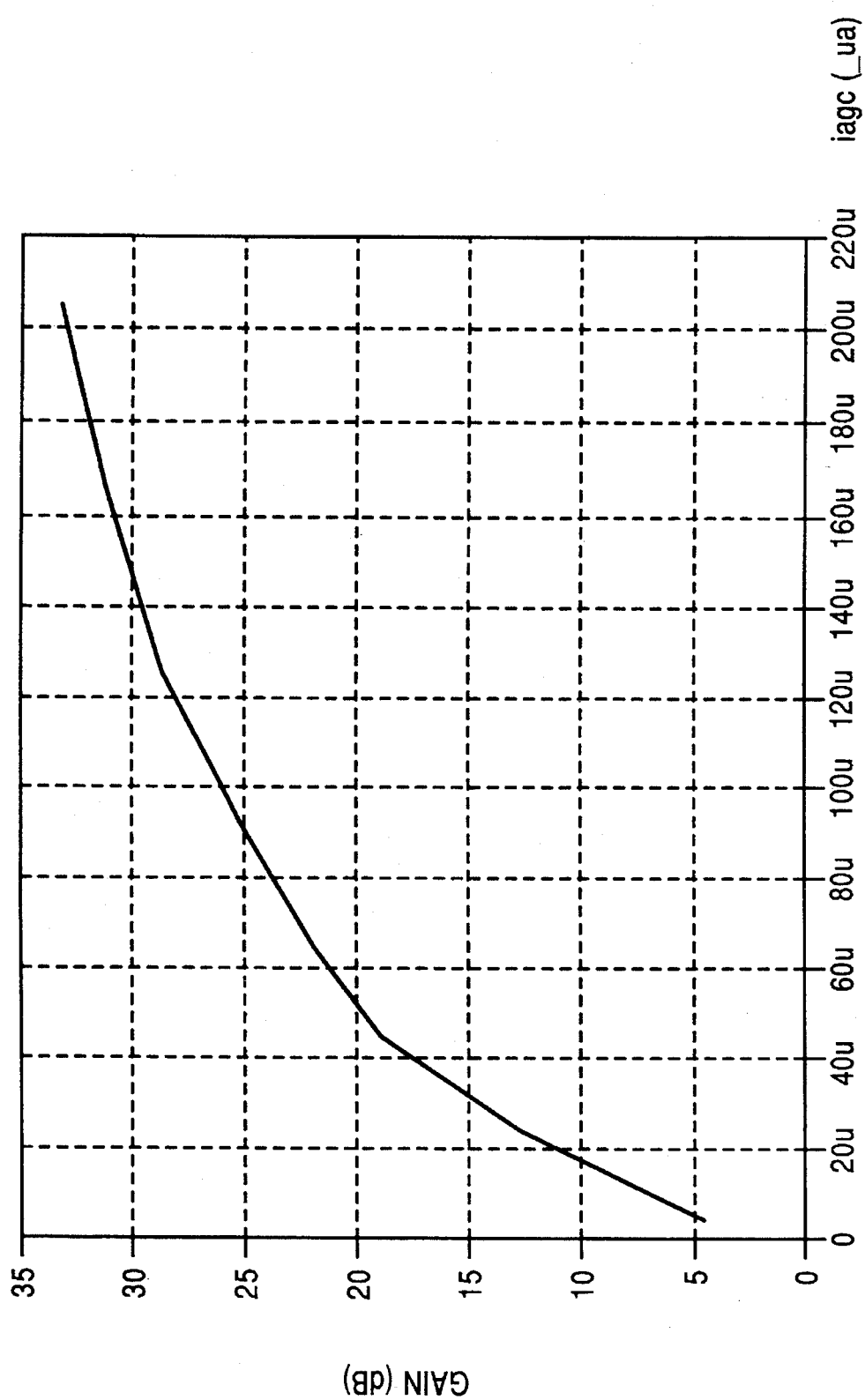
FIG. 10 shows the gain of the amplifier of FIG. 8, plotted against IAGC, in micro-amps.
Figure 11:
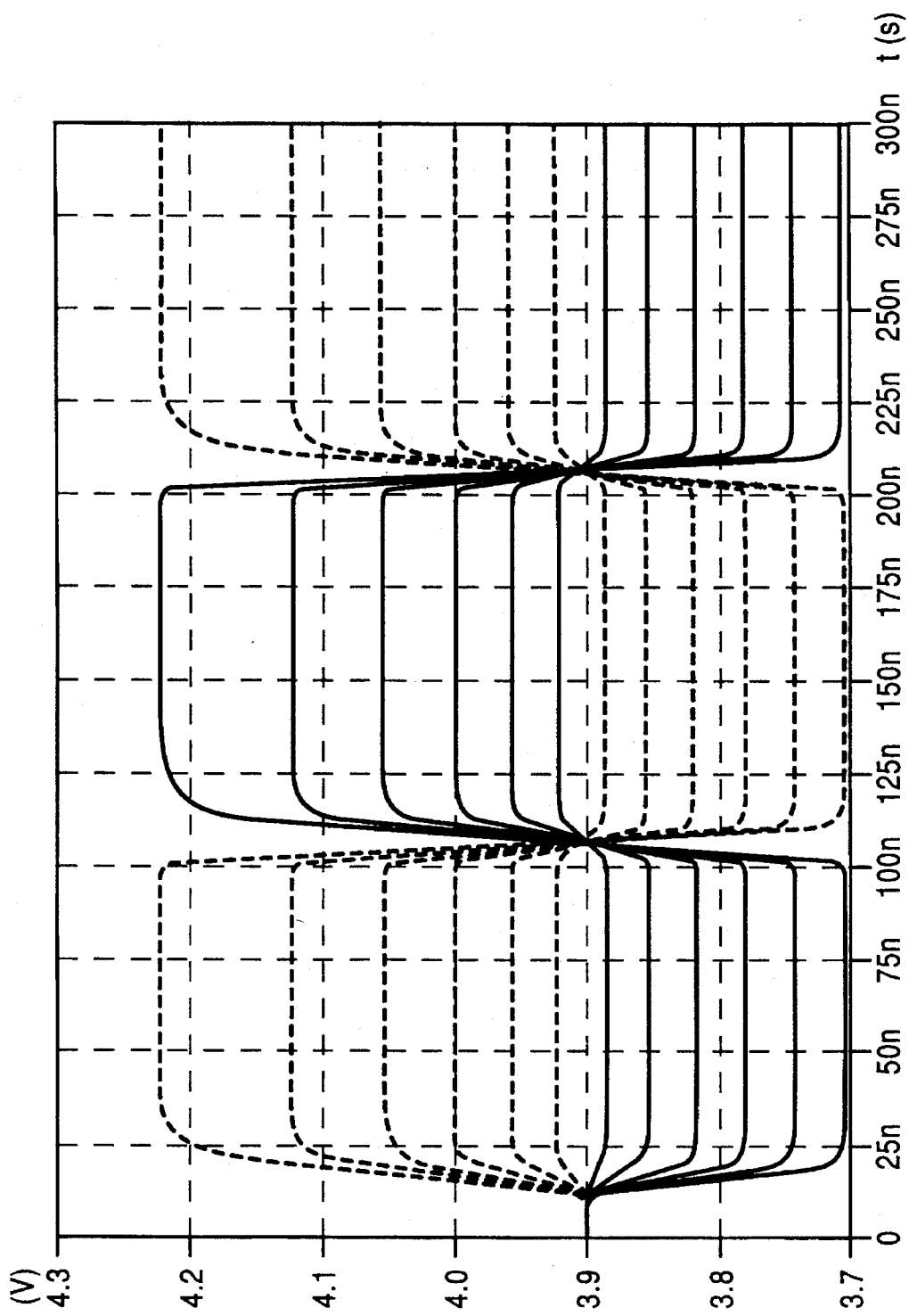
FIG. 11 shows the transient response of the amplifier of FIG. 8.
Figure 12:
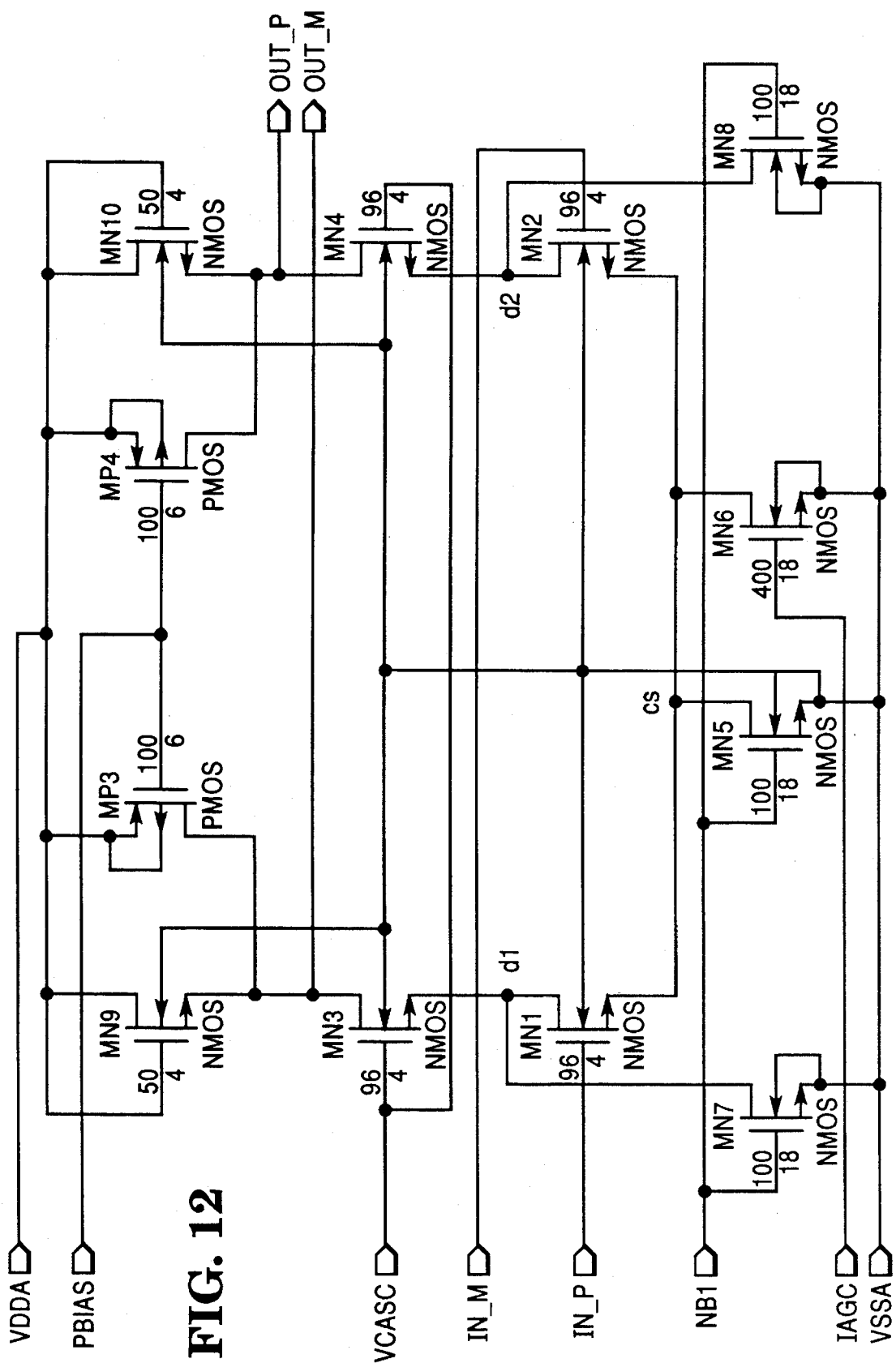
FIG. 12 shows an alternate embodiment of the amplifier of FIG. 8.
Figure 13:
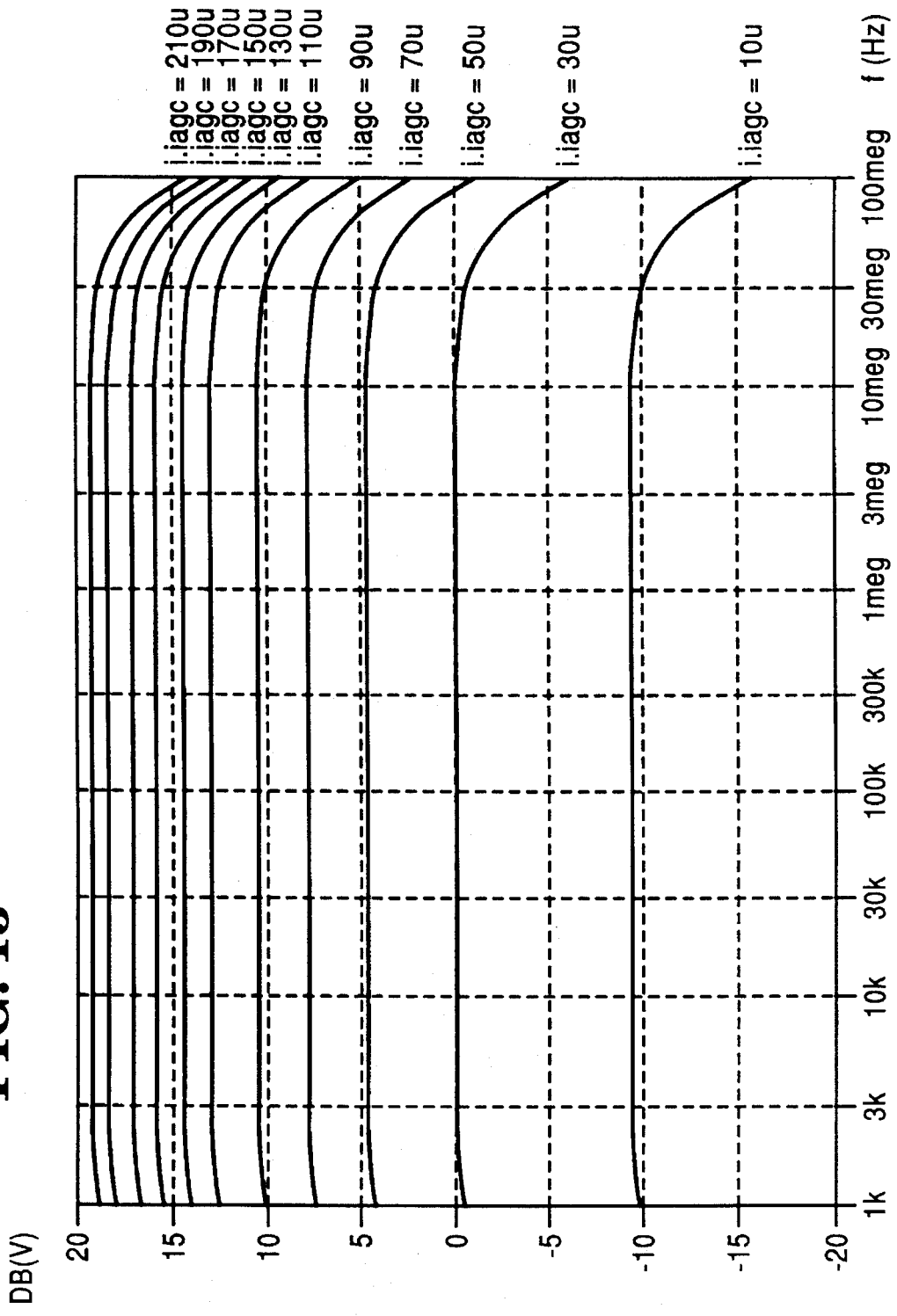
FIGS. 13, 14, and 15 provide the analogous plots for FIG. 12, as do FIGS. 9, 10, and 11 for FIG. 8.

A computer simulation, done with the commercially available program called SABER, provided the performance characteristics shown in FIGS. 10–12. The inventor points out that the open-loop 3-dB roll-off point P11 in FIG. 9 lies at about 30 MegaHertz.

Figure 14:
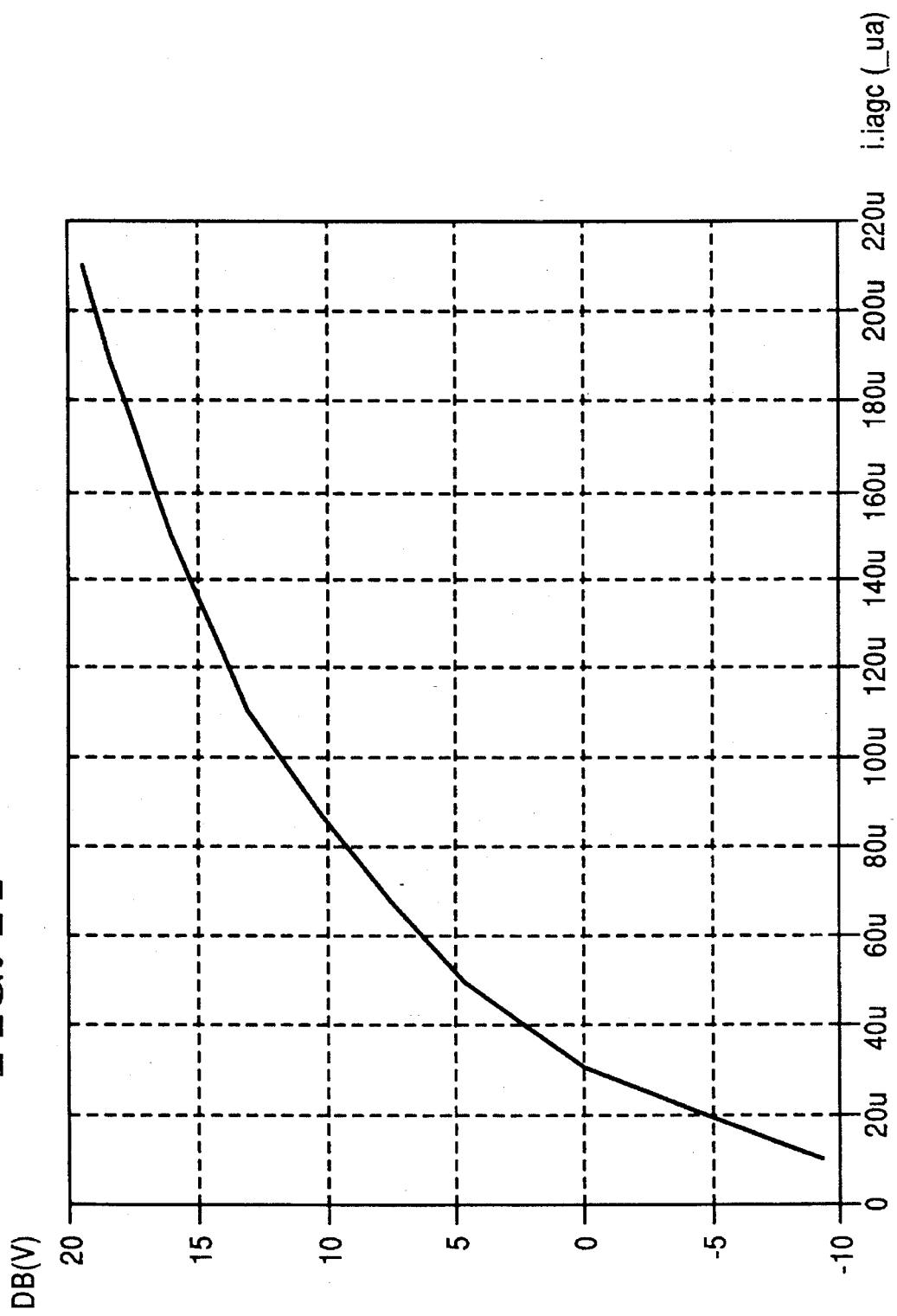
Figure 15:
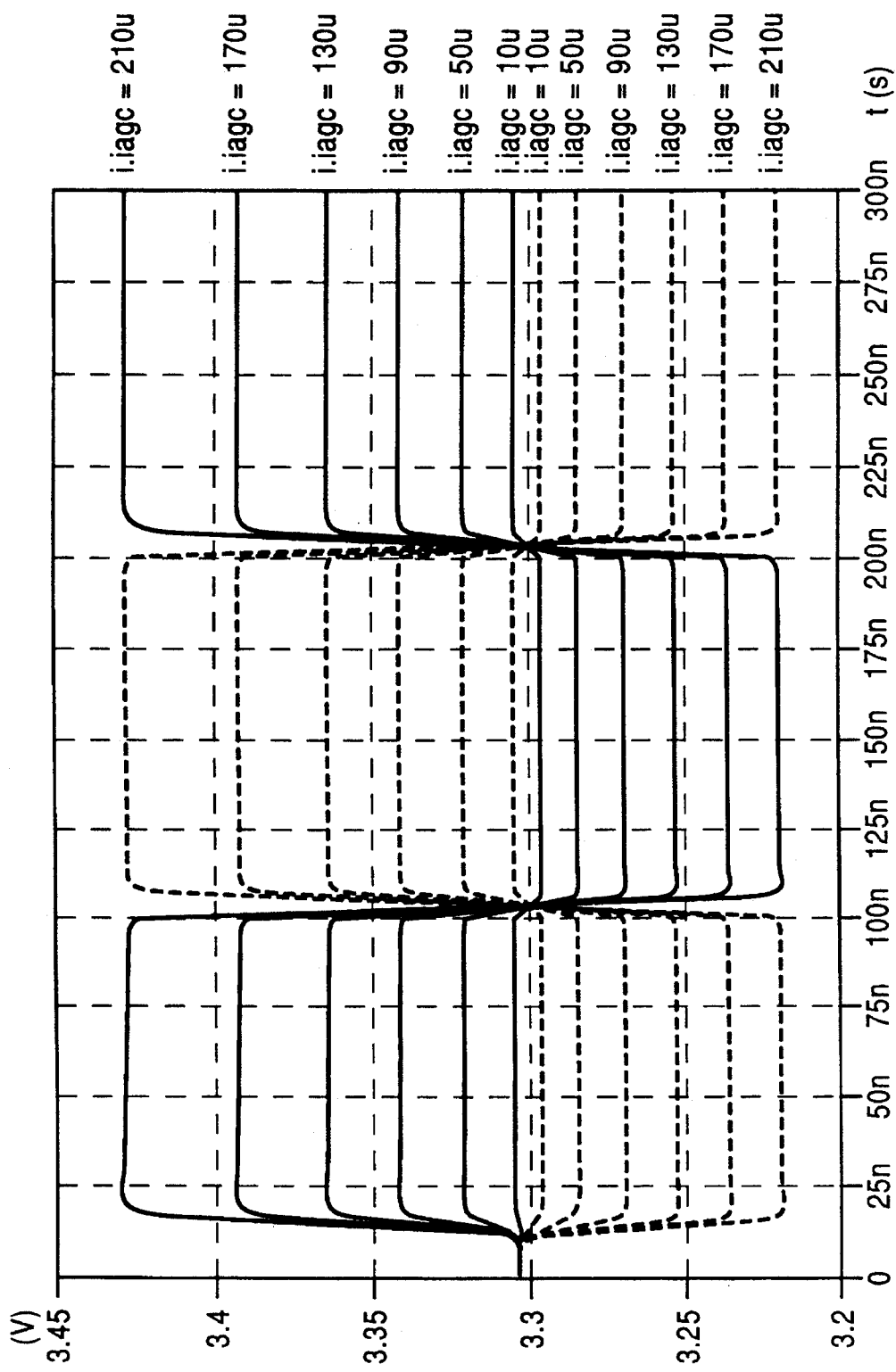
Figure 16:
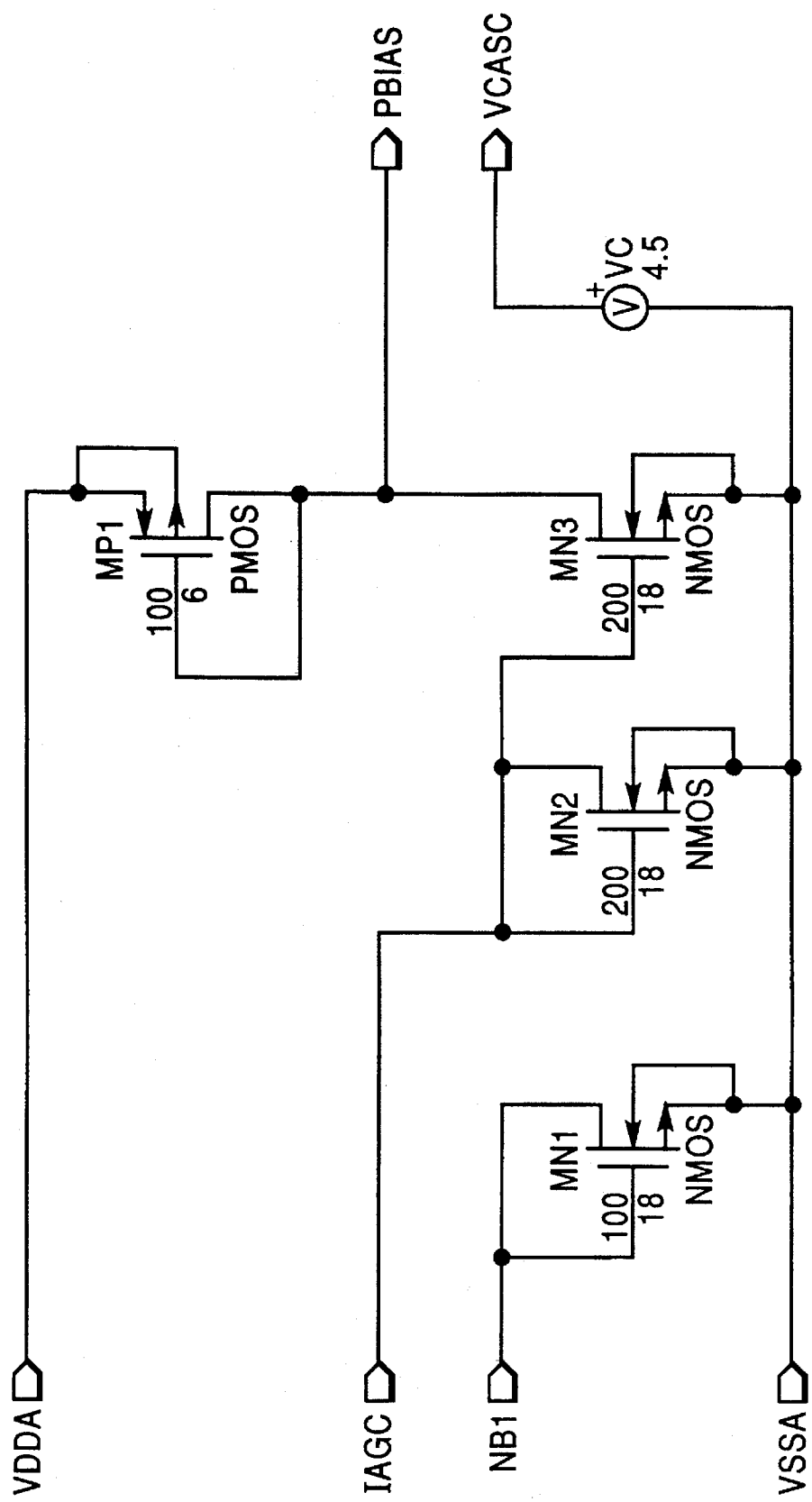
FIG. 16 illustrates one type of circuit for providing signals PBIAS and VCASC.

FIG. 12 shows an alternate version of the amplifier stage of FIG. 7. In FIG. 12, the loads are n-channel devices, providing smaller gain, but higher bandwidth, as shown in FIG. 14. FIGS. 15 and 16 are additional performance plots.

In addition, the load devices and the differential devices are both n-channel FETs having the same channel lengths. These similarities cause process variations in the various FETs to cancel. "Process variations" refer to nonuniformities in parameters, such as dopant concentrations, which occur across the surface of a semiconductor wafer being processed.

FIG. 17 shows one circuit for generating the control signals PBIAS and VCASC, used in FIG. 7. Transistors MN2 and MN3 operate as a current mirror.

In all Figures, the pairs of numbers, such as "100" and "6" near the gate of MP4 in FIG. 12, refer to the channels length and width, respectively, but in "integer layout units." Integer layout units must be multiplied by the "shrink factor," in order to obtain the actual mask dimensions in microns. In this embodiment, the shrink factor used was 0.47 (meaning that the "100" and "6" discussed above refer to 47 and 2.82 microns, respectively). It is expected that improved results will be obtained with a shrink factor of 0.30.

Numerous substitutions and modifications can be undertaken without departing from the true spirit and scope of the invention. What is desired to be secured by Letters Patent is the Invention as defined in the following claims.

I claim:

1. In a computer disc drive, the improvement comprising:
   a) an MOS differential amplifier for amplifying signals received from a read/write head; and
   b) means for adjusting the gain of said amplifier.

2. Apparatus according to claim 1, in which the bandwidth remains substantially constant as voltage gain is varied between 5 and 15 dB.

3. A computer disc drive, comprising:
   a) an MOS differential amplifier, comprising differential FETs, for amplifying signals produced by a read/write head;
   b) an auxiliary current source for providing additional currents to the differential FETs.

4. A computer disc drive, comprising:
   a) an MOS differential amplifier, comprising differential FETs and load devices, for amplifying signals produced by a read/write head;
   b) an auxiliary current source for providing additional currents to the differential FETs; and
   c) bypass means for allowing the additional currents to reach the differential FETs without passing through the load devices.

5. In a computer disc drive, the improvement comprising:
   a) an MOS differential amplifier, including
      i) differential FETs,
      ii) a load for each differential FET, each load passing a load current, and
      iii) a first common current-source for supplying a current which is shared by the differential FETs; and
   b) a second common current source for supplying a second current which is shared by the differential FETs.

6. Apparatus according to claim 5 and further comprising means for shunting load currents away from the differential FETs.

7. A computer disc drive, comprising:
   a) an MOS differential amplifier having
      i) two differential FETs and
      ii) an active load for each said FET; and
   b) a shunt FET for increasing the current passing through an active load, without increasing the current passing through the differential FET loaded by said active load.

8. In a computer disc drive, an amplifier for amplifying signals received from a read/write head, comprising:
   a) active load FETs (MP1, MP2);
   b) differential FETs (MN1 and MN2), for driving the active load FETs;
   c) a substantially constant current source (MN5), for providing current to the differential FETs;
   d) a controllable, auxiliary current source (MN6), for providing additional current to the differential FETs; and
   e) bypass means (MP3, MP4) for allowing the additional current to reach the differential FETs (MN1, MN2) without passing through the active load FETs.

9. In a computer disc drive, the improvement comprising:
   a) an MOS amplifier, which
      i) receives signals from a read/write head, and
      ii) has a 3-dB rolloff point at or above 30 MegaHertz.

10. Apparatus according to claim 9, and further comprising means for adjusting the gain of the MOS amplifier.

11. Apparatus according to claim 10, in which the MOS amplifier is capable of providing a voltage gain of 15 dB at said 3-dB rolloff point.

12. Apparatus according to claim 10, in which the MOS amplifier is capable of providing a voltage gain of 10 dB at said 3-dB rolloff point.

13. Apparatus according to claim 10, in which the MOS amplifier is capable of providing a voltage gain of 5 dB at said 3-dB rolloff point.

* * * * *